United States Patent
Lacey

(10) Patent No.: US 6,271,465 B1
(45) Date of Patent: Aug. 7, 2001

(54) LOW COST CONFORMAL EMI/RFI SHIELD

(75) Inventor: Simon Lacey, San Diego, CA (US)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/386,780

(22) Filed: Aug. 31, 1999

(51) Int. Cl.[7] ....................................... H05K 9/00
(52) U.S. Cl. ............................ 174/35 R; 174/35 GC; 361/817
(58) Field of Search ................. 174/35 R, 35 C, 174/35 MS, 35 GC; 361/679, 713, 752, 816, 817

(56) References Cited

U.S. PATENT DOCUMENTS

| | | | |
|---|---|---|---|
| 5,162,980 | * 11/1992 | Morgan et al. | 361/818 |
| 5,239,125 | * 8/1993 | Savage et al. | 174/35 MS |
| 5,252,782 | * 10/1993 | Cantrell et al. | 174/35 R |
| 5,497,292 | * 3/1996 | Gandre | 361/818 |
| 5,519,585 | 5/1996 | Jones et al. | 361/818 |
| 5,566,055 | * 10/1996 | Salvi, Jr. | 361/816 |
| 5,594,199 | * 1/1997 | Ciaccio | 174/35 R |
| 5,638,259 | * 6/1997 | McCarthy et al. | 361/800 |
| 5,696,669 | * 12/1997 | Bassler et al. | 361/816 |
| 5,704,117 | 1/1998 | Mok et al. | 29/841 |
| 5,763,824 | * 6/1998 | King et al. | 174/35 R |
| 5,825,606 | 10/1998 | Villain et al. | 361/220 |
| 5,977,480 | * 11/1999 | Timieski | 174/35 R |
| 6,023,415 | * 2/2000 | Mayer et al. | 361/816 |

FOREIGN PATENT DOCUMENTS

| | | | |
|---|---|---|---|
| 296 12 557 U1 | 7/1996 | (DE) | H05K/9/00 |
| 2 330 953 | 5/1999 | (GB) | H05K/9/00 |

* cited by examiner

*Primary Examiner*—Adolf Deneke Berhane
(74) *Attorney, Agent, or Firm*—Ohlandt, Greeley, Ruggiero & Perle, LLP

(57) ABSTRACT

An EMI/RFI shield includes a shell made from a metalized polymeric material with a shape that is predetermined to form within at least one shielded cavity. The shell has sidewalls that terminate in a flange extending at an angle to the sidewalls. The flange has a lower surface for electrically coupling the shell to a predetermined electrical potential and an upper surface for engaging a structure, preferably a protruding rib from a cover, that exerts a compressive force on the top surface for urging the lower surface into an electrical coupling arrangement with an underlying planar conductor carrying the predetermined electrical potential (e.g., ground). The lower surface can include or be placed upon a layer of electrically conductive compliant material, such as a conductive adhesive. At least one of the sidewalls can include a projecting fluted structure having a size and location that is predetermined to engage a side of the structure that exerts the compressive force.

12 Claims, 3 Drawing Sheets

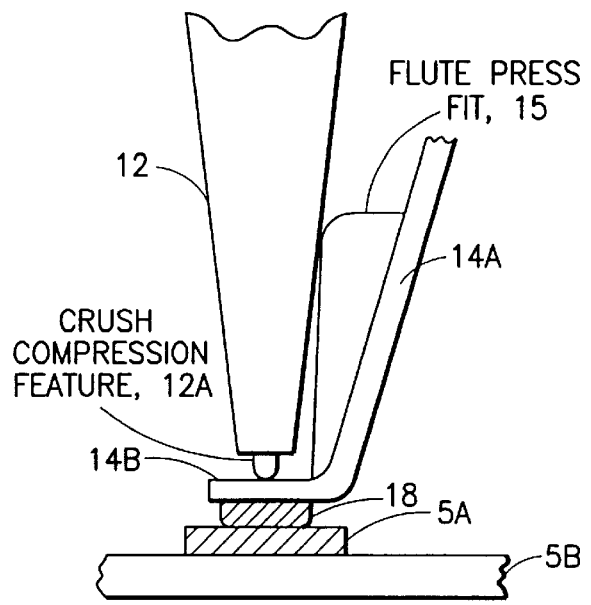
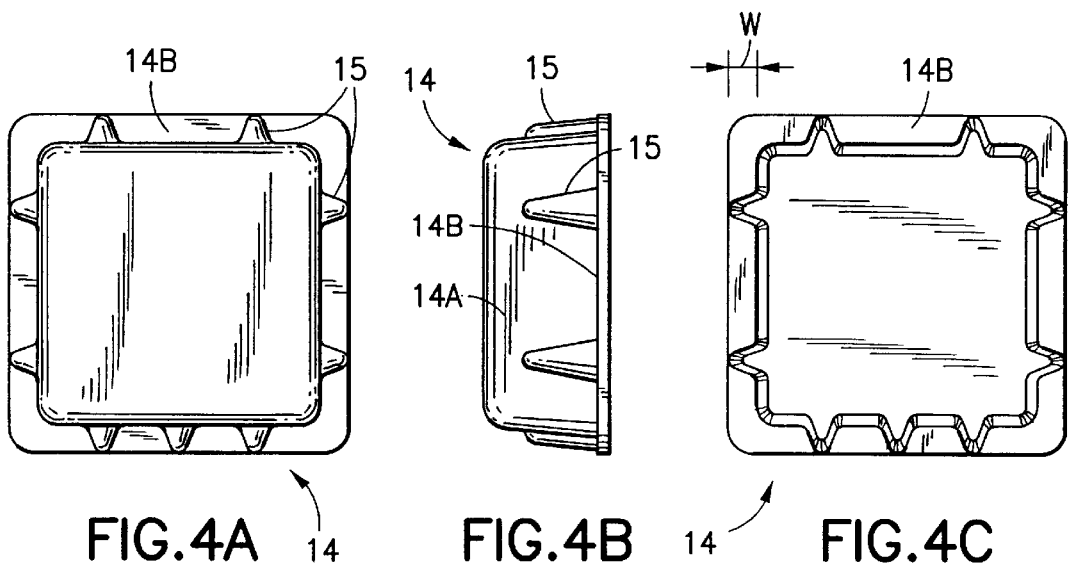

LOW COST CONFORMAL EMI/RFI SHIELD

FIELD OF THE INVENTION

This invention relates in general to electromagnetic interference (EMI) and radio frequency interference (RFI) shielding techniques and, more particularly, to methods and apparatus for providing EMI and/or RFI shielding for electronic and electrical circuitry disposed on a printed circuit board (PCB) and contained within a housing or enclosure.

BACKGROUND OF THE INVENTION

One result of the miniaturization of circuitry is that many more circuits, and different types of circuits, can be placed in close proximity to one another. For example, in some consumer goods, in particular handheld radiotelephones such as cellular telephones and personal communicators, one may find a microprocessor, a digital signal processor, a memory and sensitive RF transmit and receive circuitry all located upon a single PCB within an area of but a few square inches. It can be appreciated that to ensure reliable operation it is important to reduce or eliminate cross-coupling and interference between these various circuits, as well as to prevent externally generated interference from coupling through the radiotelephone housing into the circuits and, vice versa, to prevent signals from the circuits from coupling through the housing to external circuitry.

It is well known in the art to provide a plastic housing having a metalized inner surface to reduce the passage of undesirable signals through a housing. However, metalized housings are expensive to fabricate. Furthermore, a metalized plastic housing is not as easily recycled as an unmetalized, plastic-only housing.

It is also well known in the art to provide metal enclosures for placing over certain sensitive circuitry to prevent signals from coupling into and/or out of the circuitry. For example, sensitive receiver circuits may have a metal shield (or "can") placed over them, with the can being held in place on the PCB with fasteners (e.g., screws) or soldered into place. Some means is then also provided for electrically coupling the metal shield to a common potential, such as circuit ground or RF ground.

Referring to FIG. 1, one prior art metal shield is placed over a sensitive integrated circuit (IC) 1, and includes an inner sheet metal shield forming a sort of wall around the IC 1. The inner shield 2 has a plurality of feet or flanges 3 that are held in place with solder 4 to a conductive trace 5A (e.g., a circuit ground trace) that runs over a surface of a PCB 5B. An outer sheet metal shield 6 or cover, which may be perforated, fits over the inner shield 2 and is connected to the inner shield 2 using some type of fasteners 7, such as spot welds or rivets. For ease of handling, the inner and outer shields can be connected together before being placed on the PCB 5B and soldered (e.g., using surface mount technology) to the trace(s) 5A.

As can be appreciated, the use of this type of metal shield (which may have dimensions of only two or three centimeters along a side) has a number of disadvantages, including high cost and weight (relative to a metalized cover), as well a requirement that expensive tooling be provided.

Furthermore, the use of sheet metal places restrictions on the shapes that the metal shield can assume. Also, the use of the metal shield may have an impact on the soldering operation, due at least to the relatively larger thermal mass of the shield as compared to the surface mount solder leads found on conventional ICs and other components.

Another conventional shielding technique uses a conductive compression gasket, which may be dispensed, die-cut or metal. However, this approach is also expensive, as well as being environmentally unfriendly and logistically complex, as well as having a high tooling cost.

OBJECTS AND ADVANTAGES OF THE INVENTION

It is a first object and advantage of this invention to provide an improved EMI/RFI shielding technique that overcomes the foregoing and other problems.

It is another object and advantage of this invention to provide an electrically conductive EMI/RFI shield that is substantially lower in cost, simpler in construction, and lighter in weight than the conventional metal shield.

It is another object and advantage of this invention to provide an electrically conductive EMI/RFI shield that does not require a soldering operation or some manually intensive operation to attach to a PCB.

It is a further object and advantage of this invention to provide an electrically conductive EMI/RFI shield of simple, low cost construction that removes a requirement to metalize an inner cover of a housing or enclosure.

SUMMARY OF THE INVENTION

The foregoing and other problems are overcome and the objects of the invention are realized by methods and apparatus in accordance with embodiments of this invention. In one aspect this invention provides an electrical shield having a shell comprised of a metalized polymeric material with a shape that is predetermined to form within at least one shielded cavity. The shell has sidewalls that terminate in a flange extending at an angle to the sidewalls. The flange has a lower surface for electrically coupling the shell to a predetermined electrical potential and an upper surface for engaging a structure, preferably a protruding rib from a cover, that exerts a compressive force on the top surface for urging the lower surface into an electrical coupling arrangement with an underlying planar conductor carrying the predetermined electrical potential (e.g., ground). The lower surface can include or be placed upon a layer of electrically conductive compliant material, such as a conductive adhesive, especially for high attenuation applications (e.g., RF or any high frequency applications, such as those equal to or greater than 1 GHz.)

In a preferred embodiment at least one of the sidewalls includes a projecting fluted structure having a size and location that is predetermined to engage a side of the structure that exerts the compressive force.

In a further aspect of this invention a cover is disclosed for use with an electronic device that contains a circuit board carrying components. The cover has, on an inner surface thereof, at least one rib structure protruding from the inner surface. The rib structure is located so as to at least partially surround a portion of the components to be shielded. The rib structure has a length selected for engaging the flange that extends outward from the sloping sidewalls of the electrically conductive shield structure forming the shielded cavity over the portion of the components. The length is preselected for exerting and maintaining the compressive force on the flange when the cover is placed into an intended mechanical engagement with a remainder of the electronic device. The rib structure may further include at least one crush compression feature on a terminal end portion thereof for engaging the flange.

Also disclosed is a method for assembling an electrical shield structure over circuitry to be shielded. The method includes steps of (A) providing a circuit board containing components; (B) placing over a component to be shielded a shield comprised of a metalized polymeric material having a shape that is predetermined to form within at least one cavity, the shield having sidewalls and a flange as discussed above; and (C) installing a cover over the circuit board, the cover including the at least one rib structure that protrudes from an inner surface. The rib structure is located so as to at least partially surround the shield, and has a length selected for engaging the flange so as to exert and maintain the compressive force on the flange.

BRIEF DESCRIPTION OF THE DRAWINGS

The above set forth and other features of the invention are made more apparent in the ensuing Detailed Description of the Invention when read in conjunction with the attached Drawings, wherein:

FIG. 3B shows a detail of the rib/shield/adhesive interface of FIG. 3A, and further shows a crush compression feature at the termination of the rib, in accordance with an embodiment of this invention;

FIGS. 4A, 4B and 4C are top, side and bottom views, respectively, showing an exemplary conformal metalized shield, as well as shown in greater detail the placement of the flutes for enhancing the press fit of the shield;

DETAILED DESCRIPTION OF THE INVENTION

Figure 1:
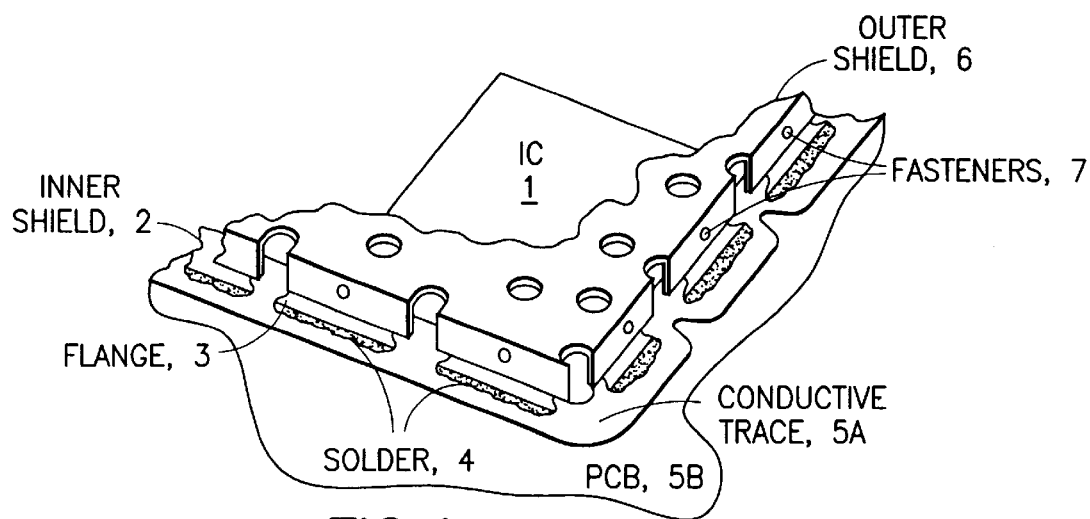
FIG. 1 is an enlarged elevational view, partly in cut-away form, of a prior art metal shield placed over an integrated circuit.
Figure 2:
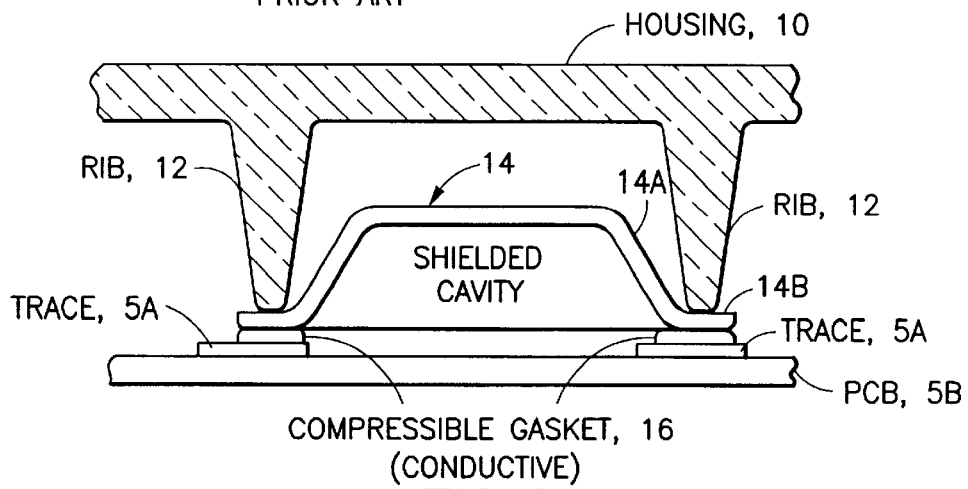
FIG. 2 is an enlarged cross-sectional view, not necessarily to scale, of a conformal metalized shield held in place with protrusions or ribs of a housing cover, and which uses a conductive compressible gasket.

FIG. 2 depicts the formation of a shielded cavity within a volume of space defined by a conformal electrically conductive shield 14. Referring also to FIGS. 4A, 4B and 4C, the shield 14 in accordance with this invention is conformal in the sense that it is not a rigid structure, as the sheet metal shield of FIG. 1. The shield 14 includes sidewalls 14A that terminate in a lip or flange 14B. A suitable, but not limiting, width (W) of the flange 14B is in a range of about 0.75 mm to about 1 mm, for a shield 14 having typical dimensions in the range of a few centimeters.

The shield 14 is preferably a vacuum-formed, thin plastic structure that is metalized or otherwise made electrically conductive. The shield 14 is thus substantially lower in cost, simpler in construction, and lighter in weight than the conventional metal shield shown in FIG. 1, thereby fulfilling one of the objects and advantages of this invention.

The shield 14 is held in place, and also electrically coupled to a ground trace 5A on PCB 5B, by a compressive force exerted by protrusions or ribs 12 extending from an enclosure or housing 10. The housing 10 could be, but is not limited to, the outer plastic cover of a radiotelephone. The ribs 12 are sized to have a length for exerting and maintaining the compressive force when the housing 10 is snapped or screwed into its intended mechanical engagement with the remainder of the enclosure (e.g., an opposing cover (not shown)). As such, it is not required to attach the shield 14 by a soldering operation, or by some manually intensive operation such as screwing or riveting the shield to the PCB 5B, thereby fulfilling another one of the objects and advantages of this invention. In this embodiment the interface between the lower surface of the flange 14B and the ground trace 5A is made through a compliant, compressible, electrically conductive gasket 16. The use of the gasket 16 may not be required for all applications, but is particularly useful for high attenuation applications (e.g., RF or any high frequency applications, such as RF applications equal to or greater than 1 GHz.)

Figure 7:
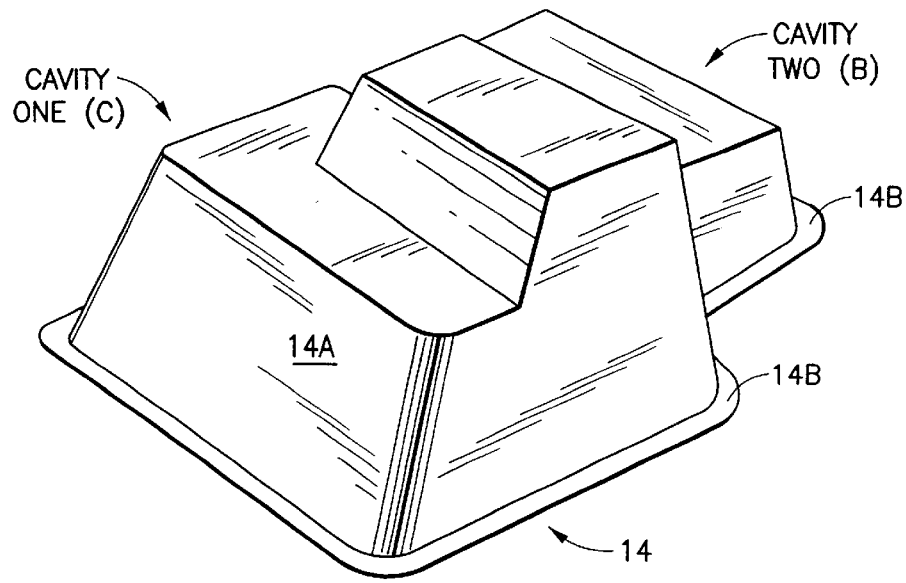
FIG. 7 is enlarged elevational view of an exemplary embodiment of the metalized conformal shield, and is useful in pointing out that the use of the metalized conformal shield enables a variety of shield shapes and geometries to be employed, and furthermore that a single shield may be able to provide a plurality of shielded enclosures.

Preferably, the EMI/RFI shielding provided by the shield 14 removes a requirement to metalize the inner cover of the housing 10, thereby fulfilling yet another of the objects and advantages of this invention. Using one or more of the shields 14 selected portions of the PCB 5B can be shielded, or the shield can be made large enough to cover all or most of the area of the PCB 5B. Multiple separate shielded cavities of different interior dimensions can be formed from one shield 14, as is made evident in the exemplary embodiment shown in FIG. 7.

Figure 3A:
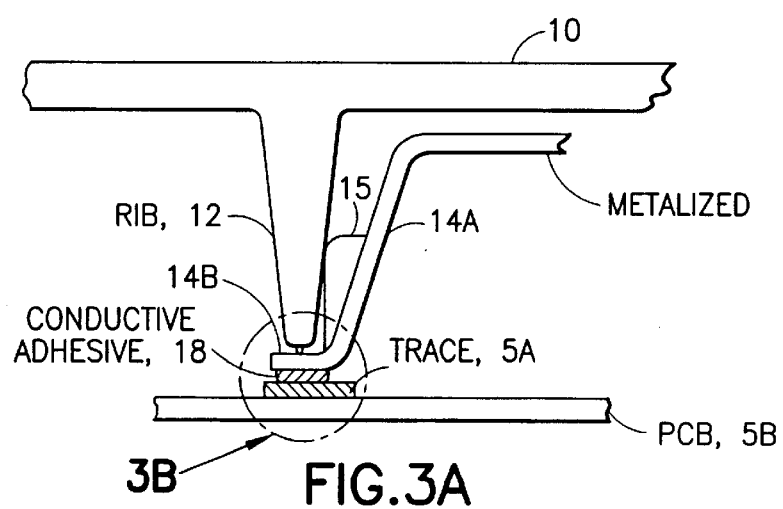
FIG. 3A is an enlarged cross-sectional view, not necessarily to scale, of the conformal metalized shield held in place with protrusions or ribs of a housing cover, and which uses a conductive adhesive as an aid in holding the shield in place while the cover is applied.

FIG. 3A is an enlarged cross-sectional view of a further embodiment of the conformal metalized shield 14, that is again held in place with the protrusions or ribs 12 of the housing 10, but which replaces the gasket 16 with an electrically conductive adhesive 18. The adhesive 18, which may be applied as a solution or as a tape to the lower surface of the flange 14B after manufacturing the shield 14, also serves to aid in holding the shield 14 in place while the cover is applied. The adhesive 18 is also slight compliant. One suitable electrically conductive adhesive is manufactured by W.L. Gore, Inc., and is referred to as GORE BOND™.

FIG. 3A also shows the use of a tapered flute feature 15 on the outer surface of the shield 14, extending outwardly from the sidewall 14A (see also FIGS. 4A–4C) for engaging the side surface of the rib 12. The flutes 15 aid in obtaining a tight interference fit by press-fitting the shield 14 into engagement with the trace 5A, and also serve to accommodate variations in rib dimensions, shield dimensions, etc. The use of the fluted features 15 in the vertical walls 14A of the shield can be used to create a tight interference fit into the mechanics prior to final assembly.

Figures 5A, 5B:
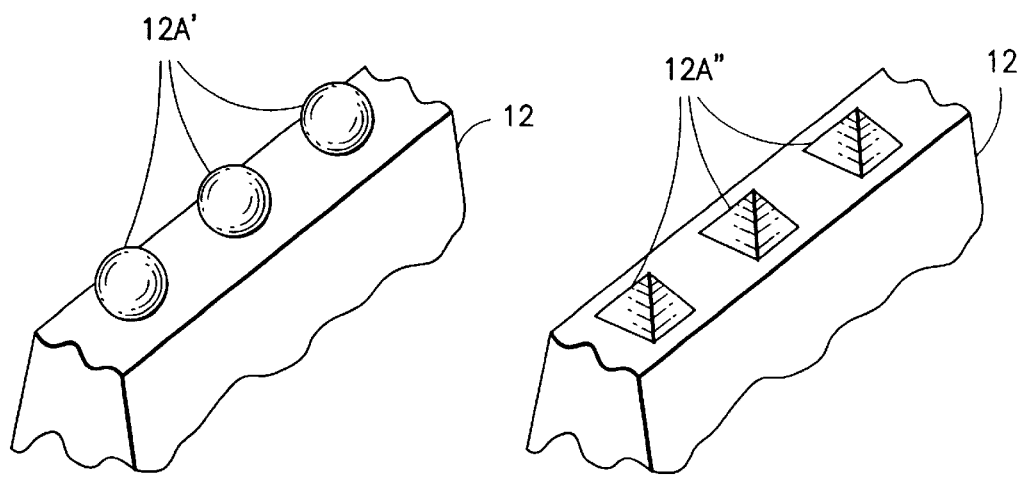
FIGS. 5A and 5B are enlarged elevational views each showing an embodiment of the crush compression features at the termination of the rib.

FIG. 3B shows a detail of the rib/shield/adhesive interface of FIG. 3A, and further shows a crush compression feature 12A at the termination of the rib 12. Referring also to FIGS. 5A (spherical crush compression features 12A') and 5B (pyramidal crush compression features 12A"), the crush compression features 12A serve to help eliminate a tolerance stack-up effect during assembly, and thus assure a tight fit of the shield flange 14B to the conductive trace 5a of the PCB 5B. The spacing between the individual ones of the crush compression features 12A is preferably a function of the required shielding effectiveness, as the closer together are the crush compression features 12A the better is the electrical contact between the shield 14 and the ground plane 5A. A continuous crush compression feature (e.g., a thin ridge that runs along the rib's terminal end surface) can be used as well. In general, the crush compression features 12A serve to magnify the compressive force applied by the housing to the shield 14 and trace 5A, via the rib(s) 12.

Figure 6:
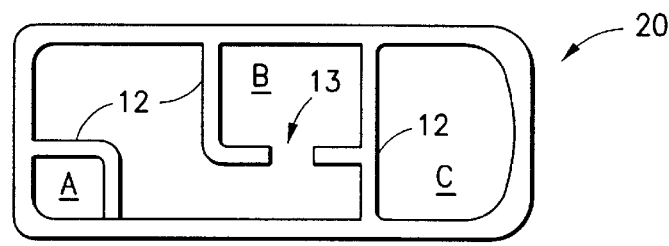
FIG. 6 is a top view of a enclosure cover for a radiotelephone, and which illustrates an exemplary rib pattern.

FIG. 6 illustrates an exemplary rib pattern in a top, inside view of an enclosure cover 20 for a radiotelephone. In this example the ribs 12 are arranged to provide three distinct areas (A, B and C) to be shielded. Three correspondingly sized and shaped shields 14 are then placed over the corresponding three areas on the PCB 5B, and when the enclosure cover 20 is snapped into place the three shields 14 are pressed into an electrically conductive engagement with suitably positioned traces 5A. FIG. 6 also makes it apparent that the ribs 12 need not be continuous around the periphery of the shield 14 (note the gap 13 in the rib 12 surrounding area B). Note should also be made that the shields for the adjacent areas B and C could actually be one shield 14 having two separate interior cavities (in a manner similar to that shown in FIG. 7.)

It is noted that the use of the adhesive (gasket) 18 may be especially desirable if the circuitry within the shielded cavity is to be tuned with the shield 14 in place, prior to final assembly. However, if the shield(s) can be added after tuning, then the adhesive may not be required. If the gasket 16 or adhesive 18 is not used, then one is provided with a simple two-part solution (i.e., the shield/rib and the underlying trace 5A on the PCB 5B.) If the gasket 16 or adhesive 18 is used, then one is instead provided with a still simple three-part solution (i.e., the shield/rib structure, the underlying trace 5A, and the interposed gasket 16 or adhesive 18.) It should be noted that if the compliant gasket 16 also has some stickiness or some adhesive properties, then the gasket 16 embodiment may merge into the adhesive 18 embodiment.

In a presently preferred, but not limiting, embodiment of this invention the shield 14 is fabricated from a vacuum formed sheet of a polymer known as PET, and has a thickness of preferably less than one millimeter, and more preferably a thickness of less than 0.5 mm, and even more preferably a thickness of about 0.2 mm. The shield 14 is made electrically conductive through a metalization process by applying a coating of gold or aluminum or copper, or any suitable electrically conductive metal, using, by example, any suitable process for applying an electrically conductive coating to a plastic material. An electrically conductive polymer material can also be used from the outset when vacuum forming the shield 14, thereby removing or relaxing the requirement to metalize the shield.

The electrical shield 14 thus includes a shell comprised of a metalized polymeric material (e.g., PET) having a shape that is predetermined to form within at least one shielded cavity. The shell has sidewalls 14A that terminate in a flange 14B extending at some angle to the sidewalls 14A. For the case of vertical sidewalls the angle is about 90 degrees. In general the angle should be one that places the lower surface of the flange 14B in a generally parallel relationship with the underling planar trace 5A. The flange 14B need not be continuous around the entire periphery of the shell of the shield 14, and in some locations a cut-out may be provided to accommodate some component or structure that is required to pass through the sidewall 14A. The flange 14B has a lower surface for electrically coupling the shell to a predetermined electrical potential (e.g., ground potential applied from trace 5A), and an upper surface for engaging a structure (rib 12) that exerts a compressive force on the top surface for urging the lower surface into an electrical coupling arrangement with a planar conductor carrying the predetermined electrical potential.

It should be appreciated that the teachings of this invention are not intended to be limited by any specific mention of materials, dimensions, or applications given above. For example, while described in the context of a radiotelephone, those skilled in the art should realize that these teachings can be applied as well to pagers, to hand-held audio, video, position location and game devices, as well as to certain cards and modules intended to be plugged into computers (e.g., PCMCIA cards and modules.)

Thus, while the invention has been particularly shown and described with respect to preferred embodiments thereof, it will be understood by those skilled in the art that changes in form and details may be made therein without departing from the scope and spirit of the invention.

What is claimed is:

1. An electrical shield, comprising a shell comprised of a metalized polymeric material having a shape that is predetermined to form within at least one shielded cavity, said shell comprising sidewalls that terminate in a flange extending at an angle to said sidewalls, said flange having a lower surface for electrically coupling said shell to a predetermined electrical potential and an upper surface for engaging a structure that exerts a compressive force on said top surface for urging said lower surface into an electrical coupling arrangement with an underlying planar conductor carrying the predetermined electrical potential.

2. An electrical shield as in claim 1, wherein said lower surface includes a layer of electrically conductive compliant material.

3. An electrical shield as in claim 1, wherein said lower surface includes a layer of electrically conductive adhesive material.

4. An electrical shield as in claim 1, wherein at least one of said sidewalls includes a projecting fluted structure having a size and location that is predetermined to engage a side of said structure that exerts the compressive force.

5. An electrical shield as in claim 1, wherein said shell is formed by a vacuum forming operation, and has a thickness of less than about 1 mm.

6. An electrical shield as in claim 1, wherein said shell is formed by a vacuum forming operation, and has a thickness of about 0.2 mm.

7. A cover for use with an electronic device comprising a circuit board containing components, said cover comprising on an inner surface thereof at least one rib structure protruding from said inner surface, said rib structure being located so as to at least partially surround a portion of said components, said rib structure having a length selected for engaging a flange that extends outwardly from sloping sidewalls of a compliant electrically conductive shield structure that forms a shielded cavity for containing said portion of said components, said rib structure having said length preselected for exerting and maintaining a compressive force on said flange when placed into an intended mechanical engagement with a remainder of said electronic device, said compressive force urging said flange against a planar conductor electrical coupling said shield structure to said conductor.

8. A cover as in claim 7, wherein said rib structure further comprises at least one crush compression feature on a terminal end portion thereof for engaging said flange.

9. A method for assembling an electrical shield structure over circuitry to be shielded, comprising steps of:

providing a circuit board containing components;

placing over a component to be shielded a shield comprised of a metalized polymeric material having a shape that is predetermined to form within at least one cavity, said shield comprising sidewalls that terminate in a flange extending at an angle to said sidewalls, said flange having a lower surface for electrically coupling said shield to a predetermined electrical potential and an upper surface for engaging a structure that exerts a compressive force on said top surface for urging said lower surface into an electrical coupling arrangement with an underlying planar conductor on said circuit board; and installing a cover over said circuit board, the cover comprising on an inner surface thereof at least one rib structure protruding from said inner surface, said rib structure being located so as to at least partially surround said shield, said rib structure having a length selected for engaging said flange so as to exert and maintain the compressive force on said flange.

10. A method as in claim 9, wherein said rib structure further comprises at least one crush compression feature on a terminal end portion thereof for engaging said flange.

11. A method as in claim 9, wherein said step of placing includes a step of interposing a layer of electrically conductive compliant material between said lower surface of said flange and said underlying planar conductor.

12. A method as in claim 9, wherein said step of placing includes a step of interposing a layer of electrically conductive adhesive material between said lower surface of said flange and said underlying planar conductor.

* * * * *